United States Patent

Evans et al.

[11] Patent Number: 5,907,762
[45] Date of Patent: May 25, 1999

[54] METHOD OF MANUFACTURE OF SINGLE TRANSISTOR FERROELECTRIC MEMORY CELL USING CHEMICAL-MECHANICAL POLISHING

[75] Inventors: David R. Evans, Beaverton, Oreg.; Sheng Teng Hsu; Jong Jan Lee, both of Camas, Wash.

[73] Assignees: Sharp Microelectronics Technology, Inc., Camas, Wash.; Sharp Kabushiki Kaisha, Osaka, Japan

[21] Appl. No.: 08/984,789

[22] Filed: Dec. 4, 1997

[51] Int. Cl.[6] .................................................. H01L 21/00
[52] U.S. Cl. .............................. 438/3; 438/240; 438/253
[58] Field of Search ................................ 438/3, 238, 239, 438/240, 253–256, 381, 396–399; 257/295

[56] References Cited

U.S. PATENT DOCUMENTS

| | | | |
|---|---|---|---|
| 3,832,700 | 8/1974 | Wu et al. | 340/173.2 |
| 4,419,809 | 12/1983 | Riseman et al. | 29/591 |
| 5,070,029 | 12/1991 | Pfiester et al. | 437/29 |
| 5,192,704 | 3/1993 | McDavid et al. | 438/3 |
| 5,300,799 | 4/1994 | Nakamura et al. | 257/295 |
| 5,303,182 | 4/1994 | Nakao et al. | 365/145 |
| 5,345,415 | 9/1994 | Nakao et al. | 365/145 |
| 5,365,094 | 11/1994 | Takasu | 257/295 |
| 5,373,462 | 12/1994 | Achard et al. | 365/145 |
| 5,416,735 | 5/1995 | Onishi et al. | 365/145 |
| 5,431,958 | 7/1995 | Desu et al. | 427/255.3 |
| 5,446,688 | 8/1995 | Torimaru | 365/145 |

OTHER PUBLICATIONS

Jiang et al. "A New Electrode Technology for High–Density Nonvolatile Ferroelectric ($SrBi_2Ta_2O_9$) Memories", IEEE 1996 Symposium on VLSI Technology Digest of Technical Papers, pp. 26–27, 1966.

*Primary Examiner*—Joni Chang
*Attorney, Agent, or Firm*—David C. Ripma; Gerald Maliszewski

[57] ABSTRACT

A method of constructing a single-transistor ferroelectric memory (FEM) cell includes: preparing a silicon substrate for construction of a FEM gate unit; forming gate, source and drain regions on the silicon substrate; forming a nitride layer over the structure to a predetermined thickness equal to a specified thickness for a bottom electrode of the FEM gate unit; forming a first insulating layer over the structure; chemically-mechanically polishing the first insulating layer such that the top surface thereof is even with the top of the nitride layer; forming the bottom electrode for the FEM cell; and chemically-mechanically polishing the bottom electrode such that the top surface thereof is even with the top surface of the first insulating layer. Additional layers are formed and polished, depending on the specific final configuration of the FEM cell.

8 Claims, 7 Drawing Sheets

METHOD OF MANUFACTURE OF SINGLE TRANSISTOR FERROELECTRIC MEMORY CELL USING CHEMICAL-MECHANICAL POLISHING

RELATED APPLICATIONS

The following applications/patents are related to the invention disclosed and claimed herein: One Transistor Ferroelectric Memory Cell and Method of Making Same, Ser. No: 08/812,579, Filed Mar. 7, 1997, now U.S. Pat. No. 5,731,608, Two Transistor Ferroelectric Memory Cell and Method of Making Same, Ser. No: 08/870,161, Filed Jun. 6, 1997; Shallow Junction Ferroelectric Memory Cell and Method of Making Same, Ser. No: 08/869,534, Filed Jun. 6, 1997; Shallow Junction Ferroelectric Memory Cell Having a Laterally Extending pn-junction and Method of Making Same, Ser. No: 08/834,499, Filed Apr. 4, 1997; Ferroelectric Memory Cell for VLSI RAM Array and Method of Making Same, Ser. No: 08/870,375, Filed Jun. 6, 1997; and Single Transistor Ferroelectric Memory Cell with Asymmetric Ferroelectric Polarization and Method of Making the Same, Ser. No: 08/905,380, Filed Aug. 4, 1997.

FIELD OF THE INVENTION

This invention relates to ferroelectric thin films which are used in nonvolatile memories, and specifically to a process of manufacturing such memories using chemical-mechanical polishing.

BACKGROUND OF THE INVENTION

Known ferroelectric random access memories (FRAM) are constructed using one transistor and one capacitor. The capacitor is generally made by sandwiching a thin ferroelectric (FE) film between two conductive electrodes, which electrodes are usually made of platinum, or an alloy thereof. The circuit configuration in the read/write sequence of this type of memory is similar to that of conventional dynamic random access memories, except that no data refreshing is required in a FRAM. Known FRAMs, however, have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of erasing and writing pulses in the memory.

The foregoing problems have been resolved, and such resolution is set forth in pending U.S. patent applications and patents identified above. In those applications and patents, however, at the time of filing same, the process for manufacturing included conventional etching and polishing of the FE memory cells. Although the memory devices made by such processes are superior to those made according to the known art at the time, problems may arise due to short circuits being caused by residual metal particles from the conductive electrodes of the capacitor contaminating the FE material and the surrounding oxides. Additionally, dry etching of FE thin films caused the electrical characteristics of those films to deteriorate. Because of the problem with metal particles causing short circuits, it is necessary to space the devices apart on the wafer and to maintain a certain size thereto, in order to keep the capacitors therein at a relatively large size. The disclosure herein provides a method to eliminate the aforementioned problems.

SUMMARY OF THE INVENTION

The method of the invention of constructing a single-transistor ferroelectric memory (FEM) cell includes: preparing a silicon substrate for construction of a FEM gate unit; forming gate, source and drain regions on the silicon substrate; forming a nitride layer over the structure to a predetermined thickness equal to a specified thickness for a bottom electrode of the FEM gate unit; forming a first insulating layer over the structure; chemically-mechanically polishing the first insulating layer such that the top surface thereof is even with the top of the nitride layer; forming the bottom electrode for the FEM cell; and chemically-mechanically polishing the bottom electrode such that the top surface thereof is even with the top surface of the first insulating layer. Additional layers are formed and polished, depending on the specific final configuration of the FEM cell.

It is an object of the invention to manufacture a FEM cell that is not susceptible to being short circuited by residual metal particles.

Another object of the invention is to provide an FEM cell that does not have a FE layer with degraded electrical characteristics as a result of the dry etching process.

A further object of the invention is to provide a FEM cell which has a very small capacitor.

These and other objects of the invention will become more fully apparent as the description which follows is read in conjunction with the drawings.

DETAILED DESCRIPTION OF THE PREFERRED EMBODIMENTS

Figure 1:
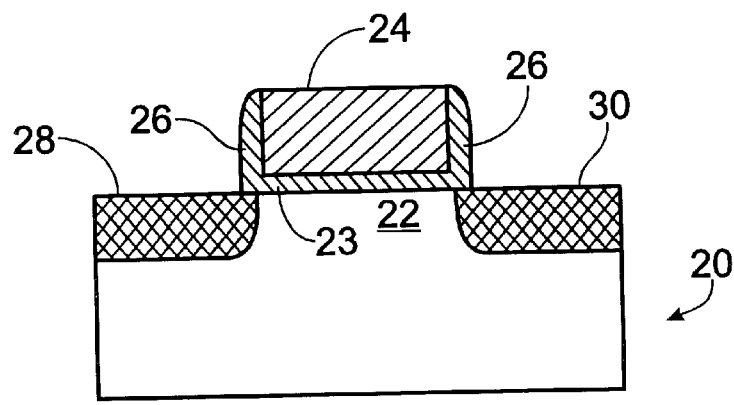
FIGS. 1–8 depict successive steps in the formation of a single-transistor ferroelectric memory cell according to the invention.

Turning initially to FIG. 1, a substrate 20 is depicted on which a ferroelectric memory (FEM) cell will be formed. The FEM cell includes a ferroelectric (FE) capacitor located on top of the gate region of a single-transistor device. As previously noted, the single-transistor FEM cell manufacturing process is disclosed in the aforementioned patent applications, which provides specifications for various types of doping, chemical-vapor deposition (CVD), and epitaxial processes.

In the preferred embodiment, substrate 20 is of the p⁻ type. A p⁻ well is formed by ion implantation and diffusion. The device is isolated either by a local oxidation (LOCOS) process, or a shallow trench isolation process followed by global planarization. The threshold voltage is then adjusted by suitable ion implantation. A convention n⁻ channel memory transistor requires channel doping on the order of $10^{17}$ ions/cm$^3$ to $10^{18}$ ions/cm$^3$, while the doping density for a p⁻ substrate is significantly lower, on the order of $10^{15}$ ions/cm$^3$.

The next step in the preferred embodiment is gate oxidation, wherein a layer 23 of silicon oxide (SiO$_2$) is thermally grown to a thickness no greater than 10 nm over what will become a gate region 22. A layer of polysilicon 24 is then deposited and doped to the desired polarity, which in the preferred embodiment is n⁺ type. Polysilicon layer 24 is etched to the desired shape, and SiO$_2$ gate sidewalls 26 are formed. Suitable ions are then implanted to form a source region 28 and a drain region 30, after which the ions are defused to provide the proper electrical characteristics for these regions.

Figure 2:
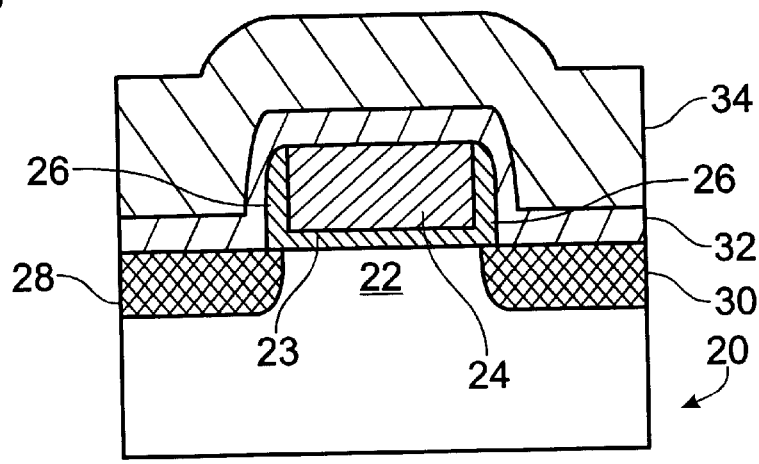

Turning now to FIG. 2, a nitride layer 32 is deposited to a thickness of between 10 nm and 30 nm. This thickness is equal to that specified for what will become the bottom electrode of the FEM cell. Either silicon nitride ($Si_3N_4$) or boron nitride (BN) may be used in this step. A layer of $SiO_2$, referred to herein as a first insulating layer 34, is then deposited such that the thickness of this layer is greater than that of the polysilicon layer 24. First insulating layer 34, such as TEOS, may be deposited by a CVD process.

Figure 3:
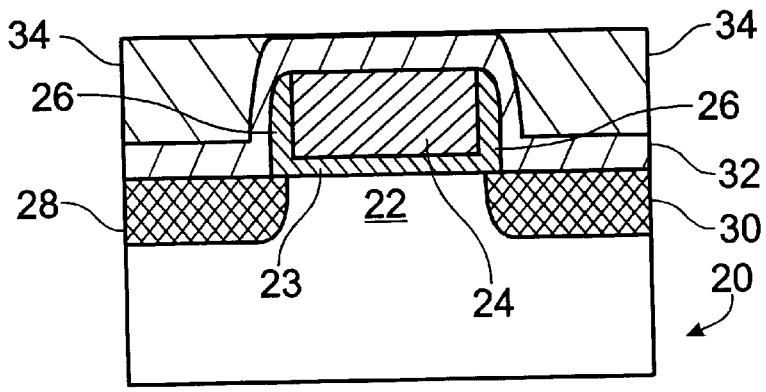

Referring now to FIG. 3, the structure is chemically-mechanically polished (CMP) to remove all of the first insulating layer above the level of the nitride layer, and to form a structure, as depicted in FIG. 3, where the first insulating layer and the top of the nitride layer are even. CMP allows for a smoothness to be within 5% uniformity across the surface of the entire wafer and does not result in the placement of residual particles in portions of the structure in which they are not supposed to be located.

Figure 4:
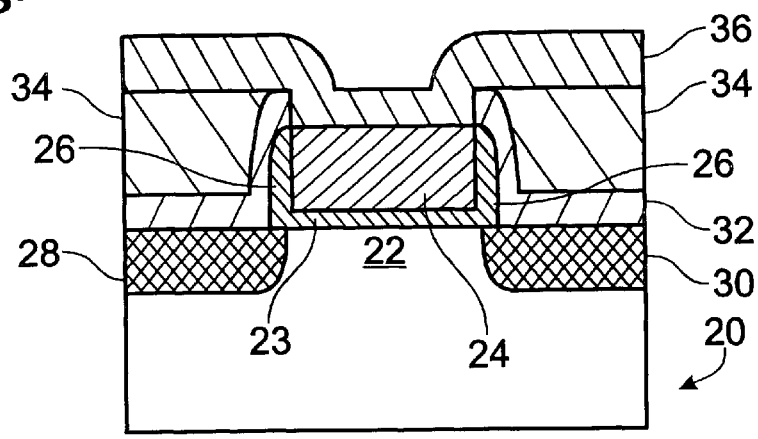

The nitride layer located above the polysilicon gate 24 is etched (FIG. 4), anisotropically, to expose the polysilicon. Material is deposited in a layer 36 that will ultimately form the bottom electrode of the FEM cell. Such material may be platinum (Pt), Pt on a barrier layer, such as Pt/TiN, Pt/TaSiN, Pt/TiSiN, or Pt/$IrO_2$. The structure depicted in FIG. 4 is subjected to a CMP process, thereby removing the portion of layer 36 which is located over the first insulating layer and any of the nitride layer, resulting in the formation of a FEM cell bottom electrode 38. As previously noted, the thickness of the bottom electrode is controlled by the thickness of nitride layer 34 which is deposited over polysilicon layer 24.

The use of CMP process to fabricate the single-transistor MFMOS non-volatile memory cell is particularly advantageous because the CMP process can level the bottom MOS structure that the ferroelectric and top electrode rest on into a very flat surface. Therefore, sol-gel, spin-on ferroelectric thin films may be used in the construction of this device. This allows the ferroelectric thin film to be continuous over the entire wafer. The MFM capacitor area is defined only by the top electrode of the FEM cell which removes the size limitations of the individual device.

To understand the CMP process, which is well known to those of skill in the art, a polishing table is used for this process. The polishing table includes a rotating pad and the wafers in their various states of construction are supported on a counter-rotating support above the pad. As the wafers are brought towards the rotating pad, a slurry, which is generally ammonia- and silicon-based, is injected as the polishing media. The chemical reaction of the slurry with the wafer tends to soften the silicon dioxide while the mechanical portion of the process smooths the surface. While it is generally possible to get a 5% uniformity on a blank wafer, using CMP process on partially constructed wafers also achieves a 5% uniformity, which makes for a more efficient device and results in fewer bad devices as a result of the manufacturing process.

Figure 6:
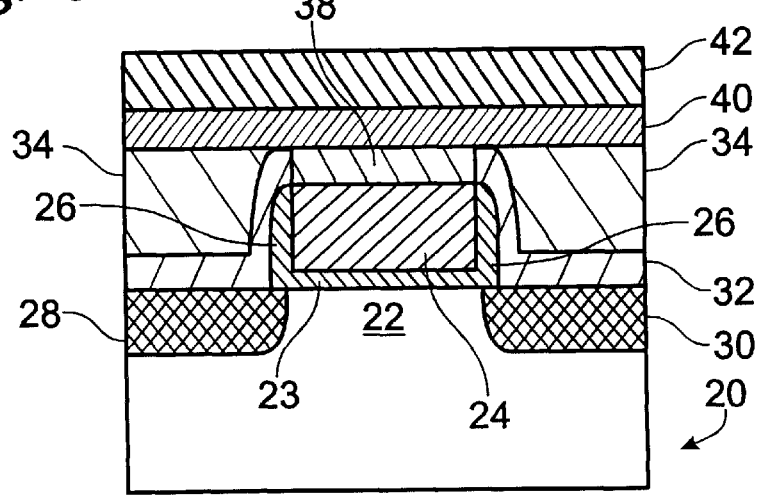

Turning now to FIG. 6, FE layer 40 is deposited. Because the structure is flat after the bottom electrode is chemically-mechanically polished, the ferroelectric thin film may be fabricated by any usual techniques, such as CVD, sputtering, sol-gel spin coat, etc. A layer 42 is deposited, which will ultimately form the top electrode of the FEM cell. This material is the same as or similar to that used for bottom electrode 38, and may be deposited in the same manner as the bottom electrode.

Figure 7:
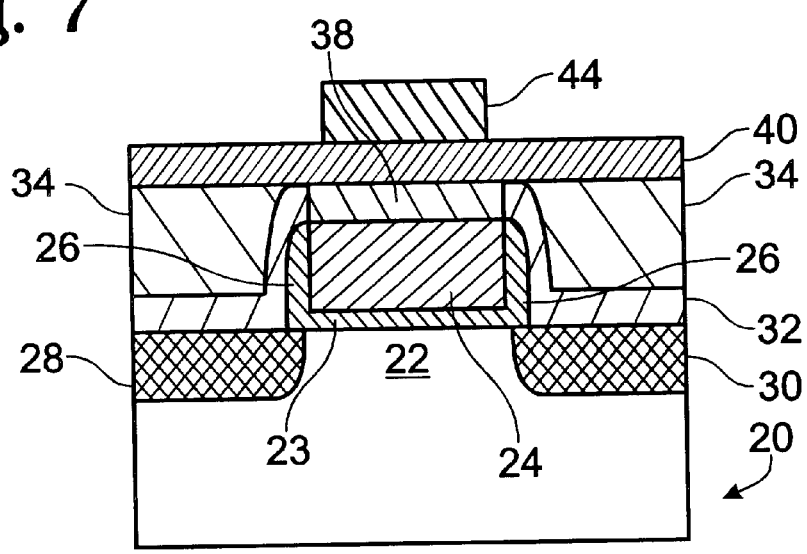

As shown in FIG. 7, layer 42 is etched to form a top electrode 44. This particular etching process may be a dry-etch process, as there is no concern or problem with extraneous particles from layer 42 remaining on top of FE layer 40.

Figure 8:
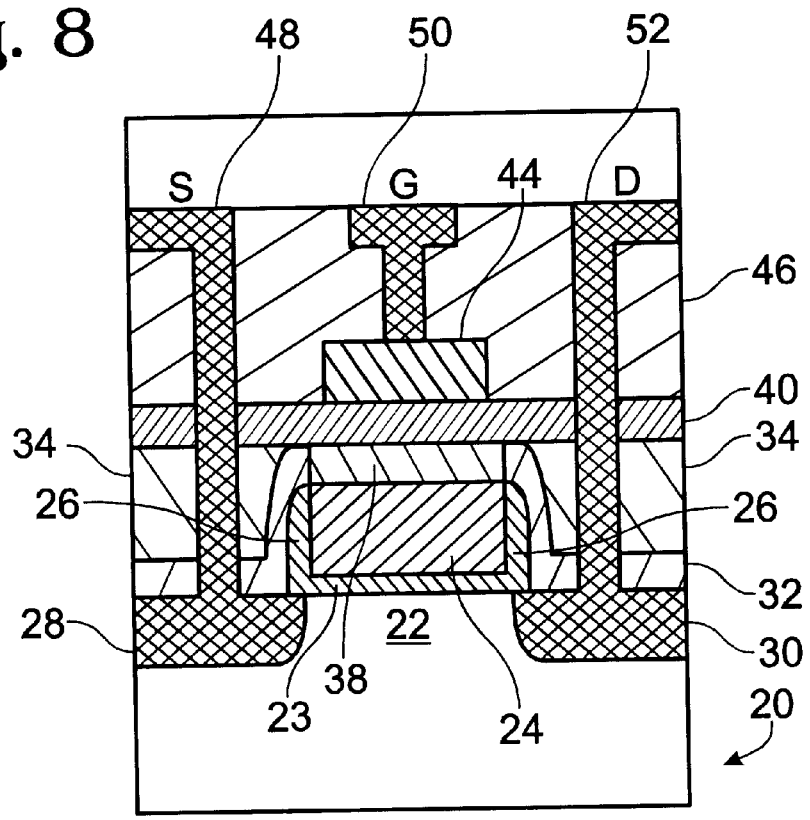

The final device is shown in FIG. 8, and includes a second insulating layer 46, generally formed of $SiO_2$. Once second insulating layer 46 is in place, suitable bores are formed through the first and second insulating layers, as well as the FE layer, to allow for metalization of the finished structure, which includes a source electrode 48, a gate electrode 50, and a drain electrode 52.

An alternate way of forming the preceding device is to deposit the metal for the bottom electrode, with or without a barrier metal, after the doping of polysilicon layer 24. In this case, both the bottom electrode and the polysilicon would be etched at the same time, and would allow the elimination of some of the intermediate steps.

Figure 5:
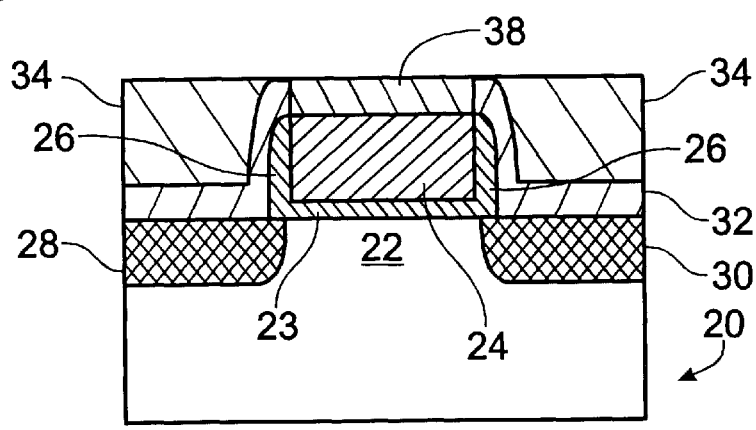
Figure 9:
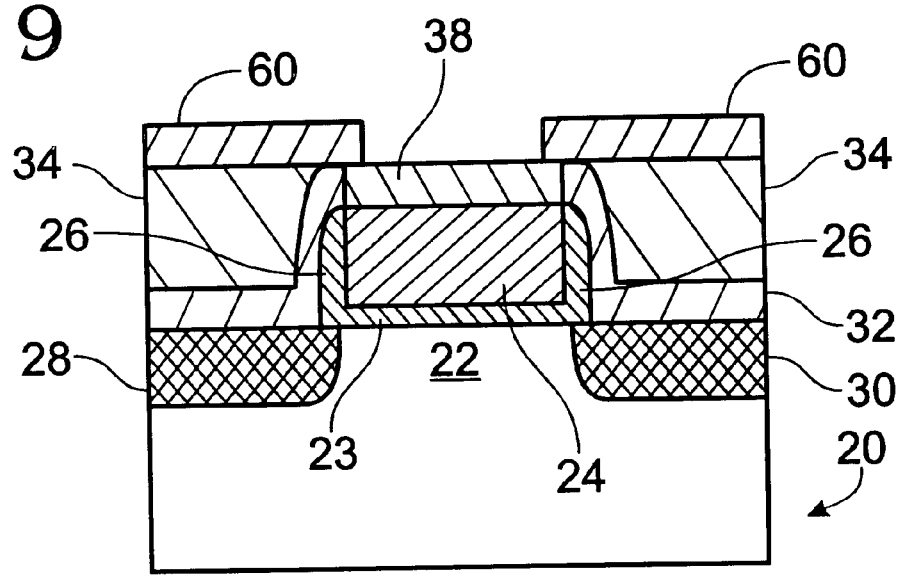
FIGS. 9–12 depict successive steps in the formation of an alternate method of forming the FEM cell according to the invention.

Referring now to FIG. 9, a variation of the method previously disclosed will be described. This particular variation begins with the structure as shown in FIG. 5. To that structure is added an interdiffusion barrier layer 60, which is then etched to expose bottom electrode 38. Barrier layer 60 may be deposited, as by CVD, and may be formed of material such as $TiO_2$ or $Ta_2O_5$, which is deposited on top of first insulating layer 34. Alternately, a mask may be placed on top of bottom electrode 38 and the interdiffusion barrier layer laid down, and the mask stripped away.

Figure 10:
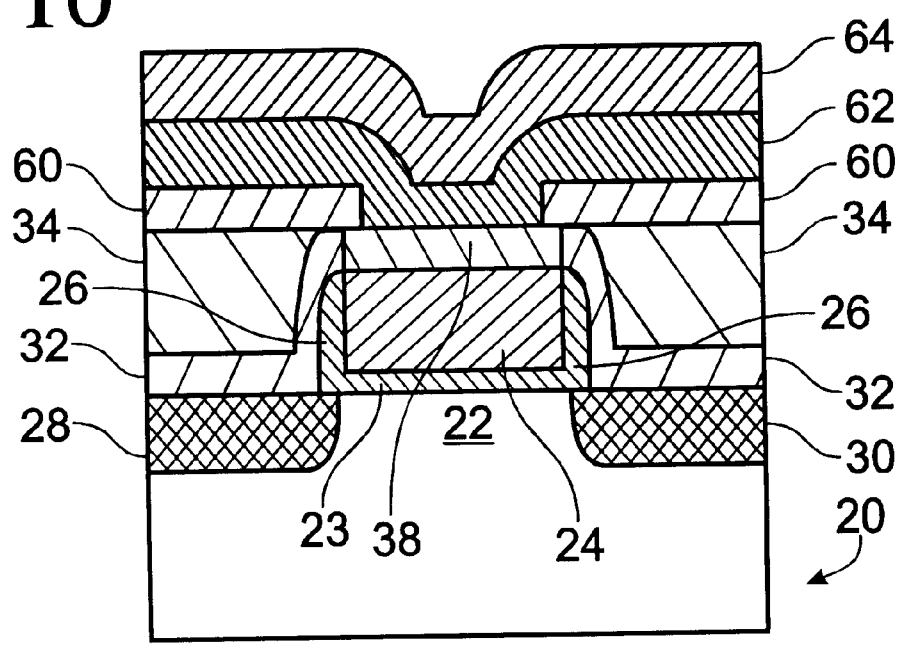

Referring now to FIG. 10, FE layer 62 may be deposited, as previously described. A layer 64 may then be deposited on top of FE layer 62, which layer will ultimately form the top electrode.

Figure 11:
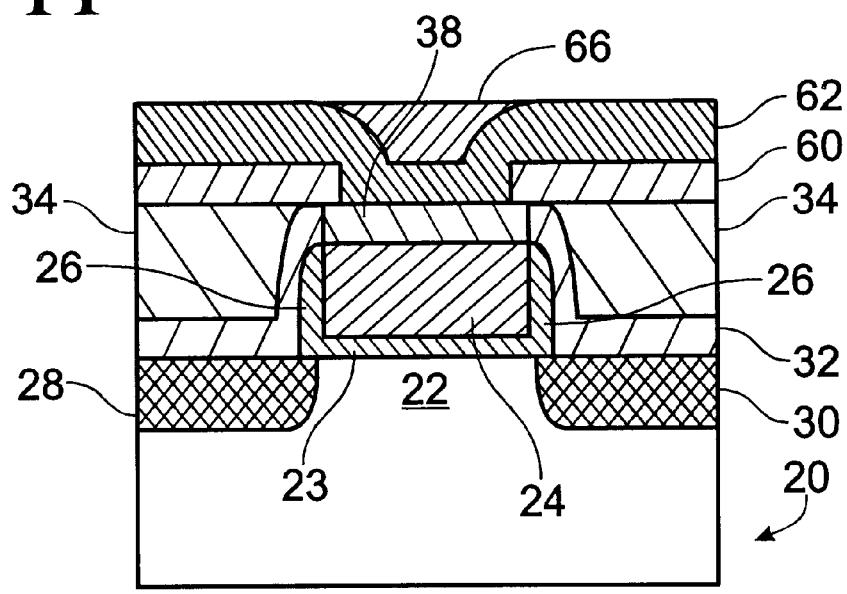
Figure 12:
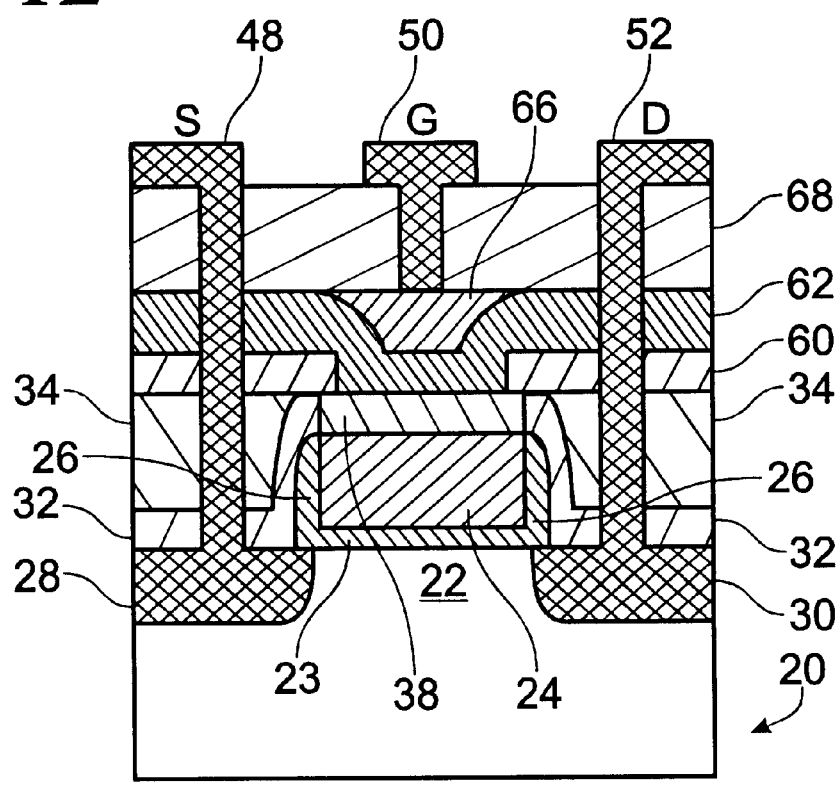
Figure 13:
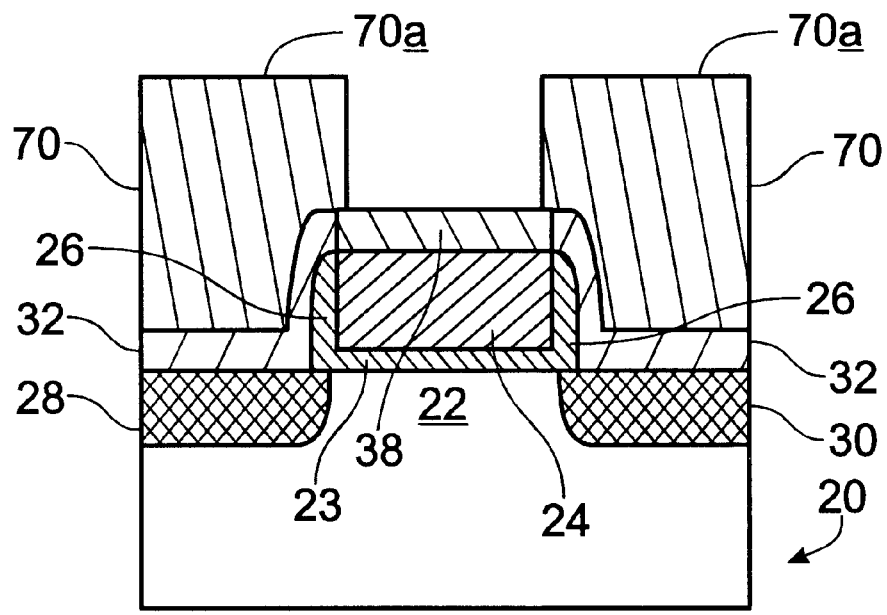
FIGS. 13–16 depict a third method of forming a FEM cell according to the invention.

Referring now to FIG. 11, the structure is depicted after CMP process, and shows a continuous FE layer 62 and a top electrode 66. Again, and now referring to FIG. 12, a second insulating layer 68 is deposited, after which suitable bores are formed in the structure to allow the metalization of the structure, thereby forming source electrode 48, gate electrode 50, and drain electrode 52. This construction provides a different ratio of the various active layers of the FEM cell.

A third embodiment of the method of the invention again begins with the structure shown in FIG. 5, but which includes a much thicker first insulating layer 70, which is deposited to a thickness allowing the top surface 70a thereof, to be at the height of the top of the specified height of the upper surface of the top electrode for the FEM cell. Again, the insulting layer may be laid down and smoothed to its desired thickness by CMP, and the area above the bottom electrode etched clear, or, the bottom electrode may be masked, the first insulting layer laid down, polished, and then the mask stripped away.

Figure 14:
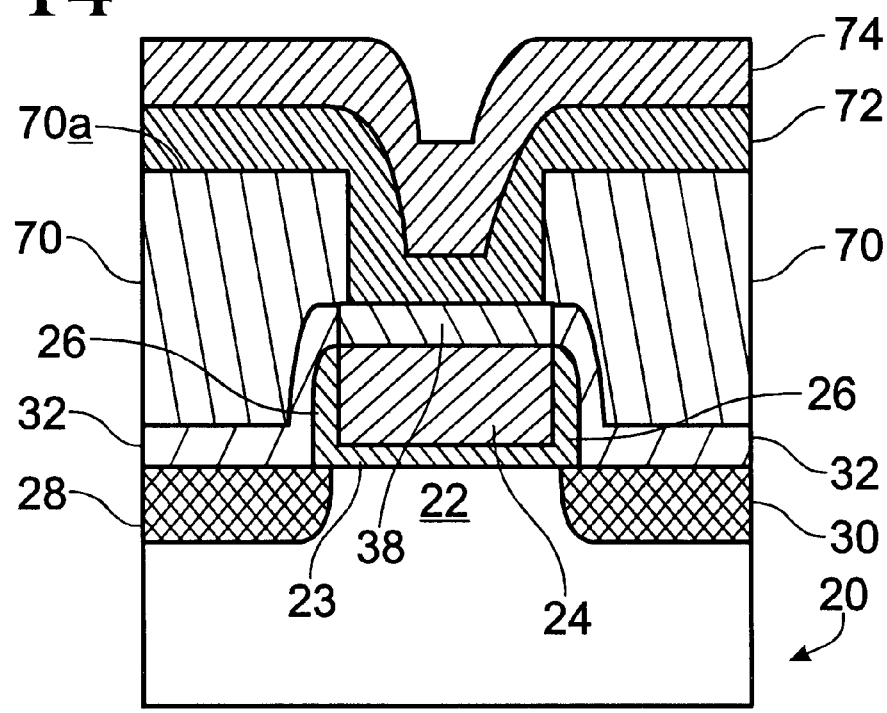
Figure 15:
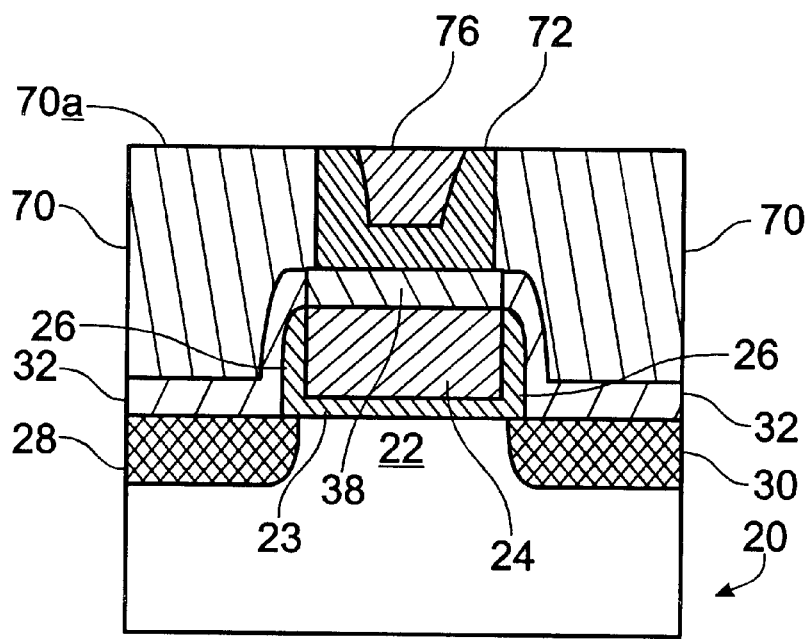
Figure 16:
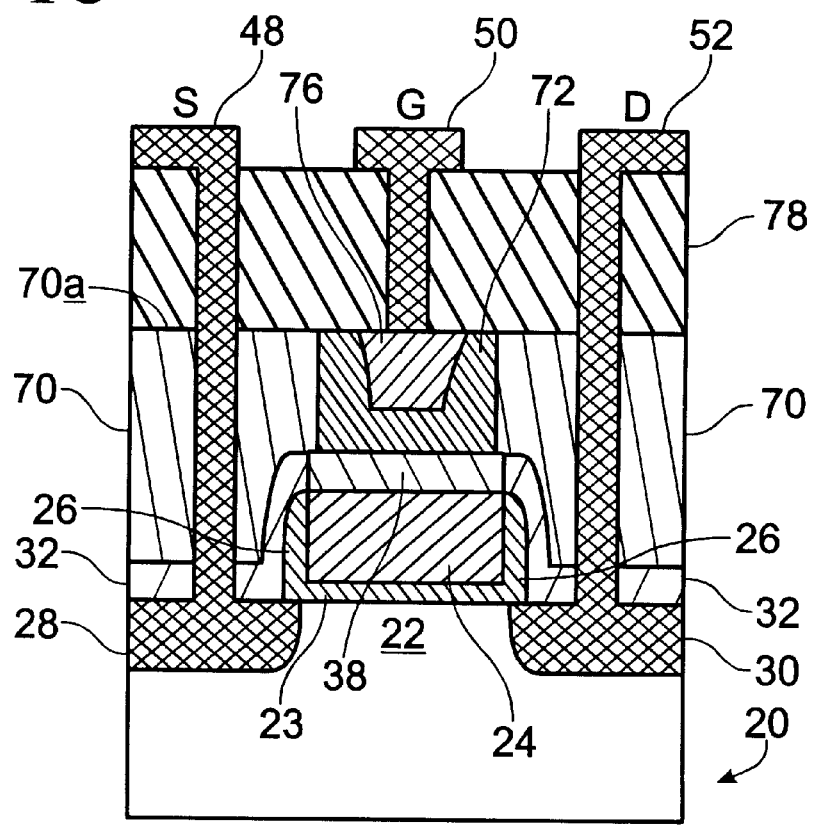

Referring now to FIG. 14, a FE layer 72 is deposited, followed by deposition of a layer 74, which will form the top electrode. As shown in FIG. 15, the structure is polished by CMP to the level of the upper surface of a top electrode 76. FE layer 72 is not continuous across the entire wafer in this particular embodiment. Again, and now referred to FIG. 16, a second insulting layer 78 is deposited, after which suitable bores are formed in the structure, allowing for metalization and the forming of a source electrode 48, a gate electrode 50, and a drain electrode 52.

It should be appreciated that this invention is part of a complete integrated circuit fabrication process for forming nonvolatile memories or other programmable devices. The method is applicable to any semiconductor material technology wherein a ferroelectric material is used as part of a capacitor or other device.

Although a preferred embodiment of the invention, and several variations thereof, have been disclosed, it should be appreciated that further variations and modifications may be made thereto without departing from the scope of the invention as defined in the appended claims.

We claim:

1. A method of constructing a single-transistor ferroelectric memory (FEM) cell comprising:

preparing a silicon substrate for construction of a FEM gate unit;

forming a gate SiO$_2$ layer on the substrate thereby forming a gate region;

forming a polysilicon layer over the gate SiO$_2$ layer;

doping the polysilicon layer to a desire polarity;

etching the polysilicon layer to form a gate electrode;

forming a SiO$_2$ gate sidewall;

implanting ions in the silicon substrate to form a source region and a drain region;

diffusing the implanted ions in the silicon substrate to form the source region and the drain region;

forming a nitride layer over the structure resulting from the previous step to a thickness equal to a specified thickness for a bottom FEM cell electrode of the FEM gate unit;

forming a first SiO$_2$ insulating layer over the structure resulting from the previous step;

chemically-mechanically polishing the first SiO$_2$ insulating layer such that a top surface thereof is even with a top surface of the nitride layer;

masking and etching the nitride layer over the gate region;

forming a bottom electrode for the FEM cell; and chemically-mechanically polishing the bottom electrode such that a top surface thereof is even with the top surface of the first SiO$_2$ insulating layer.

2. The method of claim 1 which further includes forming a FE layer across the top of the structure resulting from the previous step; forming a top electrode over the FE layer; etching the top electrode to within lateral margins of the gate region; forming a second SiO$_2$ insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

3. The method of claim 1 which further includes depositing an interdiffusion barrier over the first SiO$_2$ insulating layer; etching the interdiffusion barrier to expose the bottom FEM cell electrode; forming a FE layer; forming a top electrode over the FE layer; chemically mechanically polishing the top electrode such that a top surface thereof is even with a top surface of the FE layer; forming a second SiO$_2$ insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

4. The method of claim 1 which further includes depositing an interdiffusion barrier over the first SiO$_2$ insulating layer; etching the interdiffusion barrier to expose the bottom FEM cell electrode; forming a FE layer; forming a top electrode over the FE layer; chemically mechanically polishing the top electrode and the FE layer such that a top surface thereof is even with a top surface of the interdiffusion barrier; forming a second SiO$_2$ insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

5. A method of constructing a single-transistor ferroelectric memory (FEM) cell comprising:

preparing a silicon substrate for construction of a FEM gate unit;

forming gate, source and drain regions on the silicon substrate;

forming a nitride layer over the structure resulting from the previous step to a thickness equal to a specified thickness for a bottom FEM cell electrode of the FEM gate unit;

forming a first insulating layer over the structure resulting from the previous step;

chemically-mechanically polishing the first insulating layer such that a top surface thereof is even with a top surface of the nitride layer;

forming the bottom FEM cell electrode for the FEM cell; and chemically-mechanically polishing the bottom electrode such that the top surface thereof is even with the top surface of the first insulating layer.

6. The method of claim 5 which further includes forming a FE layer across the top of the structure resulting from the previous step; forming a top electrode over the FE layer; forming a second insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

7. The method of claim 5 which further includes depositing an interdiffusion barrier over the first insulating layer; etching the interdiffusion barrier to expose the bottom FEM cell electrode; forming a FE layer; forming a top electrode over the FE layer; chemically mechanically polishing the top electrode such that a top surface thereof is even with the a surface of the FE layer; forming a second insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

8. The method of claim 5 which further includes depositing an interdiffusion barrier over the first insulating layer; etching the interdiffusion barrier to expose the bottom FEM cell electrode; forming a FE layer; forming a top electrode over the FE layer; chemically mechanically polishing the top electrode and the FE layer such that a top surface thereof is even with a top surface of the interdiffusion barrier; forming a second insulating layer over the structure resulting from the previous step; tapping the structure resulting from the previous step to form bores for a source electrode, a gate electrode and a drain electrode; and metallizing the structure resulting from the previous step to form the source electrode, the gate electrode and the drain electrode.

* * * * *